(12) United States Patent
Lovett et al.

(10) Patent No.: US 12,169,791 B2
(45) Date of Patent: Dec. 17, 2024

(54) MODEL DEVELOPMENT FRAMEWORK FOR REMOTE MONITORING CONDITION-BASED MAINTENANCE

(71) Applicant: Otis Elevator Company, Farmington, CT (US)

(72) Inventors: Teems E. Lovett, Glastonbury, CT (US); Murat Yasar, West Hartford, CT (US); Nikola Trcka, West Hartford, CT (US); Peter Liaskas, Norwalk, CT (US); Kin Gwn Lore, Manchester, CT (US)

(73) Assignee: OTIS ELEVATOR COMPANY, Farmington, CT (US)

( * ) Notice: Subject to any disclaimer, the term of this patent is extended or adjusted under 35 U.S.C. 154(b) by 1105 days.

(21) Appl. No.: 16/354,585

(22) Filed: Mar. 15, 2019

(65) Prior Publication Data

US 2020/0065691 A1 Feb. 27, 2020

Related U.S. Application Data

(60) Provisional application No. 62/720,520, filed on Aug. 21, 2018.

(51) Int. Cl.
*G06F 30/20* (2020.01)
*G06N 5/048* (2023.01)
*G06N 20/00* (2019.01)

(52) U.S. Cl.
CPC ............ *G06N 5/048* (2013.01); *G06F 30/20* (2020.01); *G06N 20/00* (2019.01)

(58) Field of Classification Search
CPC ................. G06N 3/00; G06N 3/086

USPC .......................................................... 706/12
See application file for complete search history.

(56) References Cited

U.S. PATENT DOCUMENTS

| | | | |
|---|---|---|---|
| 6,330,935 B1 | 12/2001 | Systermans | |
| 10,776,760 B2 * | 9/2020 | Ethington | G06N 7/01 |
| 11,144,930 B2 * | 10/2021 | Sosale | G06Q 30/016 |
| 11,225,399 B2 * | 1/2022 | Ye | B66B 25/006 |
| 2018/0086597 A1 | 3/2018 | Song et al. | |
| 2018/0150806 A1 * | 5/2018 | Eleid | G06Q 10/109 |

(Continued)

FOREIGN PATENT DOCUMENTS

| | | |
|---|---|---|
| CN | 102765643 A | 11/2012 |
| CN | 102923538 A | 2/2013 |

(Continued)

OTHER PUBLICATIONS

Extended European Search Report for application No. 19192931.4-1017; Mailing Date: Feb. 3, 2020; 11 pages.

(Continued)

*Primary Examiner* — Andy Ho
(74) *Attorney, Agent, or Firm* — CANTOR COLBURN LLP

(57) ABSTRACT

Embodiments include techniques for developing a model framework for remote unit monitoring condition-based maintenance. The techniques include collecting data associated with unplanned service requests, and generating one or more models from the collected data. The techniques also include predicting unplanned service requests based at least in part on the one or more models, and transmitting an output of the prediction of the unplanned service request.

20 Claims, 5 Drawing Sheets

(56) References Cited

U.S. PATENT DOCUMENTS

2019/0112151 A1* 4/2019 Hattori .................. B66B 5/0025
2021/0279578 A1* 9/2021 Bryant ..................... G06N 3/08

FOREIGN PATENT DOCUMENTS

| CN | 104528489 A | 4/2015 |
| CN | 104944243 A | 9/2015 |
| CN | 104961014 A | 10/2015 |
| CN | 105731209 A | 7/2016 |
| CN | 105752783 A | 7/2016 |
| CN | 105775943 A | 7/2016 |
| CN | 105923483 A | 9/2016 |
| CN | 106315319 A | 1/2017 |
| CN | 107194053 A | 9/2017 |
| CN | 107265230 A | 10/2017 |
| CN | 107381268 A | 11/2017 |
| CN | 107826919 A1 | 3/2018 |
| EP | 3456673 A1 | 3/2019 |
| EP | 3587326 A1 | 1/2020 |
| JP | 2013023325 A | 2/2013 |
| KR | 20170075267 A | 7/2017 |
| WO | 2018014502 A1 | 1/2018 |

OTHER PUBLICATIONS

Dragan Djurdjanovic et al., "Watchdog Agent—an infotronics-based prognostics approach for product performance degradation assessment and prediction" Advanced Engineering Informatics, vol. 17, Issues 3-4, 2003, pp. 109-125 (Abstract Only).

Eduardo Gilabert et al., "Intelligent automation systems for predictive maintenance: A case study", Robotics and Computer-Integrated Manufacturing, vol. 22, Issues 5-6, Oct.-Dec. 2006, pp. 543-549, Abstract Only.

CN Office Action; Issued: Dec. 3, 2020; CN Application No. 201910768385.9; Filed: Aug. 20, 2019; 5 pages.

* cited by examiner

MODEL DEVELOPMENT FRAMEWORK FOR REMOTE MONITORING CONDITION-BASED MAINTENANCE

CROSS-REFERENCE TO RELATED APPLICATIONS

This application claims the benefit of U.S. Provisional Application No. 62/720,520, filed Aug. 21, 2018, which is incorporated herein by reference in its entirety.

BACKGROUND

The embodiments herein relate to modeling systems, and more specifically to developing a model framework for remote unit monitoring condition-based maintenance.

Many complex systems such as elevator systems and escalator systems collect data to monitor the performance of the system over a period of time. This data can be collected manually from service mechanics or from other sources such as sensors that are configured to read various operational or alarm data from the systems. In addition, some data can be provided by other external or third-party systems that provide monitoring services. There may be an opportunity to leverage the gathered data to perform predictive and diagnostic analytics to reduce the failures and downtime associated with the system.

BRIEF SUMMARY

According to an embodiment, a system for developing a model framework for remote unit monitoring condition-based maintenance is provided. The system includes a storage medium, the storage medium being coupled to a processor, where the processor configured to collect data associated with unplanned service requests, and generate one or more models from the collected data. The processors is also configured to predict an unplanned service request based at least in part on the model, and transmit an output of the prediction of the unplanned service request.

In addition to one or more of the features described herein, or as an alternative, further embodiments use the data including at least one of unit data, performance data, or service records.

In addition to one or more of the features described herein, or as an alternative, further embodiments use data including at least two of the unit data, performance data, or service records.

In addition to one or more of the features described herein, or as an alternative, further embodiments include using unit data, performance data, and service records.

In addition to one or more of the features described herein, or as an alternative, further embodiments include at least one of an elevator unit or an escalator unit.

In addition to one or more of the features described herein, or as an alternative, further embodiments include models that are generated using a supervised machine-learning process.

In addition to one or more of the features described herein, or as an alternative, further embodiments include generating the one or more models based on generating a health score for the unit.

In addition to one or more of the features described herein, or as an alternative, further embodiments include a processor that is configured to select a model of the one or more models, and test the selected model based on an independent dataset from the collected data.

In addition to one or more of the features described herein, or as an alternative, further embodiments include providing an output including at least one of a unit ID, an estimated score related to the probability of a request for service request, and one or more features that contributed to the estimated score.

In addition to one or more of the features described herein, or as an alternative, further embodiments include providing an output of the model to update a maintenance schedule.

According to a different embodiment, a method for developing a model framework for remote unit monitoring condition-based maintenance is provided. The method includes collecting data associated with unplanned service requests, and generating one or more models from the collected data. The method also includes predicting unplanned service requests based at least in part on the one or more models, and transmitting an output of the prediction of the unplanned service request.

In addition to one or more of the features described herein, or as an alternative, further embodiments use data including at least one of unit data, performance data, or service records.

In addition to one or more of the features described herein, or as an alternative, further embodiments use data including at least two of the unit data, performance data, or service records.

In addition to one or more of the features described herein, or as an alternative, further embodiments use data including unit data, performance data, and service records.

In addition to one or more of the features described herein, or as an alternative, further embodiments include at least one of an elevator unit or an escalator unit.

In addition to one or more of the features described herein, or as an alternative, further embodiments include one or more models that are generated using a supervised machine-learning process.

In addition to one or more of the features described herein, or as an alternative, further embodiments include generating the one or more models using a generated a health score for the unit.

In addition to one or more of the features described herein, or as an alternative, further embodiments include selecting a model of the one or more models, and testing the selected model based on an independent dataset from the collected data.

In addition to one or more of the features described herein, or as an alternative, further embodiments provide an output including at least one of a unit ID, an estimated score related to the probability of a request for service request, and one or more features that contributed to the estimated score.

In addition to one or more of the features described herein, or as an alternative, further embodiments include updating a maintenance schedule based at least in part on the output.

Technical effects of embodiments of the present disclosure include strategically and methodically predicting a customer callback by leveraging data that is collected by the system. In addition, the prediction can be optimized over time as the maintenance schedules and equipment are updated.

The foregoing features and elements may be combined in various combinations without exclusivity, unless expressly indicated otherwise. These features and elements, as well as the operation thereof, will become more apparent in light of the following description and the accompanying drawings. It should be understood, however, that the following description and drawings are intended to be illustrative and explanatory in nature and non-limiting.

BRIEF DESCRIPTION OF THE DRAWINGS

The present disclosure is illustrated by way of example and not limited in the accompanying figures in which like reference numerals indicate similar elements.

DETAILED DESCRIPTION

In the event a breakdown or failure occurs in a system, maintenance or service mechanics must be called to address the reported issue. Next, a repair must be scheduled to visit the location of the malfunctioning system. In some scenarios, the experienced downtime is increased because the scheduling of the service mechanic is based on the severity of the issue and the availability of the service mechanic.

The techniques described herein include implementing a dynamic machine-learning process, unlike the conventional static solutions, where a window of time is determined where a customer is likely to report an issue. The models that are generated can be optimized with independent data to further reduce the downtime by scheduling maintenance before the expiry of the window. Further optimization of the models can accurately modify the window of a customer callback. In addition, the data can be provided to a service mechanic prior to arriving at a job site to indicate the top features that contribute to the predicted callback. The results of the model can be used to strategically adapt how and when maintenance will be performed for one or more units of the system based on the prediction of a customer callback provided by the model.

By making data-driven predictions and decisions through building the model, the model can be optimized and used for adjusting the maintenance schedules to preempt any customer callbacks. Therefore, the health of the customer equipment can be maintained while reducing the number of callbacks and downtime is experienced by the customer.

Figure 1:
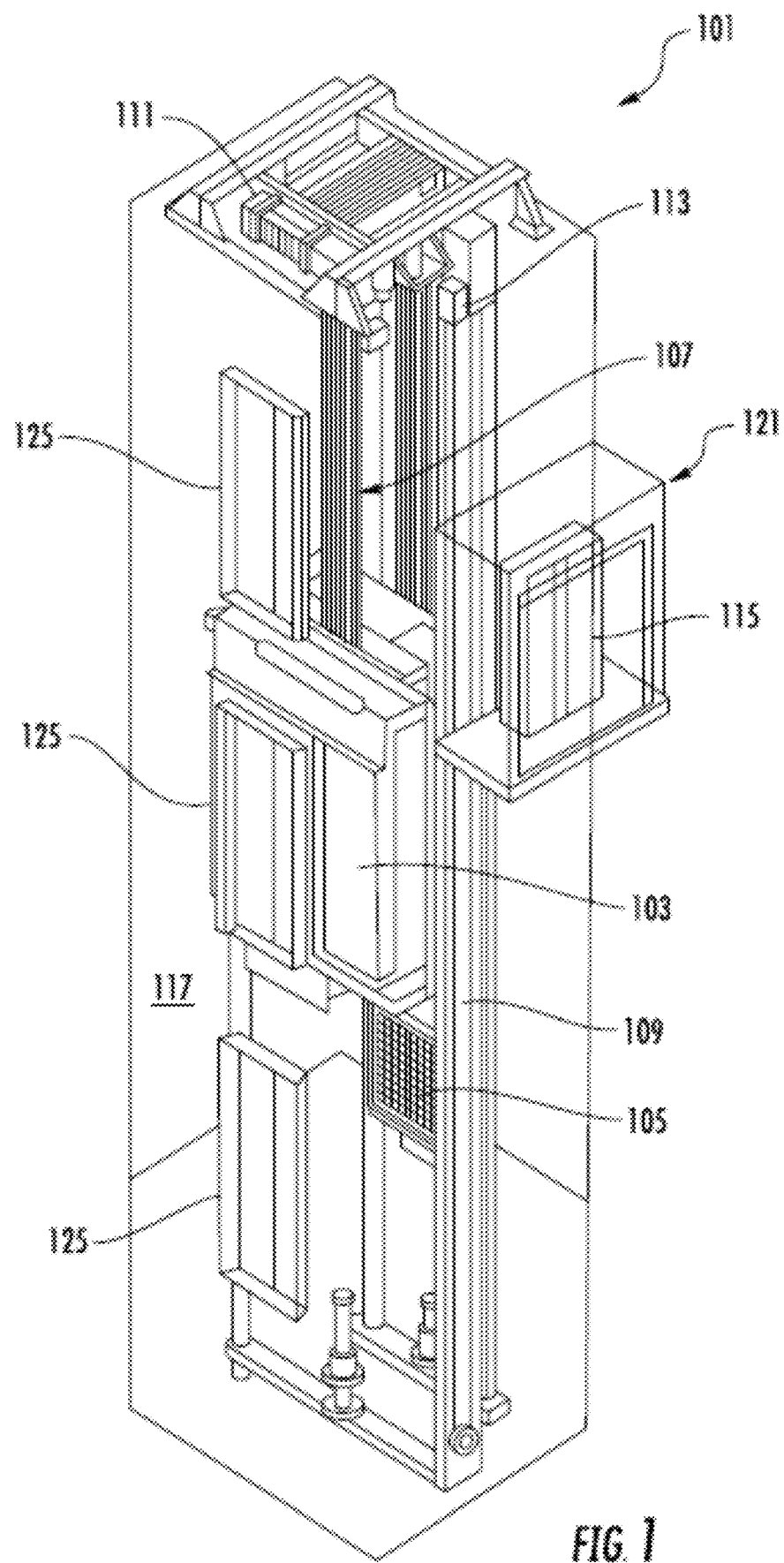
FIG. 1 is a schematic illustration of an elevator system that may employ various embodiments of the present disclosure.

Turning now to an overview of the technology, FIG. 1 is a perspective view of an elevator system 101 including an elevator car 103, a counterweight 105, a tension member 107, a guide rail 109, a machine 111, a position reference system 113, and a controller 115. The elevator car 103 and counterweight 105 are connected to each other by the tension member 107. The tension member 107 may include or be configured as, for example, ropes, steel cables, and/or coated-steel belts. The counterweight 105 is configured to balance a load of the elevator car 103 and is configured to facilitate movement of the elevator car 103 concurrently and in an opposite direction with respect to the counterweight 105 within an elevator shaft 117 and along the guide rail 109.

The tension member 107 engages the machine 111, which is part of an overhead structure of the elevator system 101. The machine 111 is configured to control movement between the elevator car 103 and the counterweight 105. The position reference system 113 may be mounted on a fixed part at the top of the elevator shaft 117, such as on a support or guide rail, and may be configured to provide position signals related to a position of the elevator car 103 within the elevator shaft 117. In other embodiments, the position reference system 113 may be directly mounted to a moving component of the machine 111, or may be located in other positions and/or configurations as known in the art. The position reference system 113 can be any device or mechanism for monitoring a position of an elevator car and/or counter weight, as known in the art. For example, without limitation, the position reference system 113 can be an encoder, sensor, or other system and can include velocity sensing, absolute position sensing, etc., as will be appreciated by those of skill in the art.

The controller 115 is located, as shown, in a controller room 121 of the elevator shaft 117 and is configured to control the operation of the elevator system 101, and particularly the elevator car 103. For example, the controller 115 may provide drive signals to the machine 111 to control the acceleration, deceleration, leveling, stopping, etc. of the elevator car 103. The controller 115 may also be configured to receive position signals from the position reference system 113 or any other desired position reference device. When moving up or down within the elevator shaft 117 along guide rail 109, the elevator car 103 may stop at one or more landings 125 as controlled by the controller 115. Although shown in a controller room 121, those of skill in the art will appreciate that the controller 115 can be located and/or configured in other locations or positions within the elevator system 101. In one embodiment, the controller may be located remotely or in the cloud.

The machine 111 may include a motor or similar driving mechanism. In accordance with embodiments of the disclosure, the machine 111 is configured to include an electrically driven motor. The power supply for the motor may be any power source, including a power grid, which, in combination with other components, is supplied to the motor. The machine 111 may include a traction sheave that imparts force to tension member 107 to move the elevator car 103 within elevator shaft 117.

Although shown and described with a roping system including tension member 107, elevator systems that employ other methods and mechanisms of moving an elevator car within an elevator shaft may employ embodiments of the present disclosure. For example, embodiments may be employed in ropeless elevator systems using a linear motor to impart motion to an elevator car. Embodiments may also be employed in ropeless elevator systems using a hydraulic lift to impart motion to an elevator car. FIG. 1 is merely a non-limiting example presented for illustrative and explanatory purposes.

In other embodiments, the system comprises a conveyance system that moves passengers between floors and/or along a single floor. Such conveyance systems may include escalators, people movers, etc. Accordingly, embodiments described herein are not limited to elevator systems, such as that shown in FIG. 1.

Figure 2:
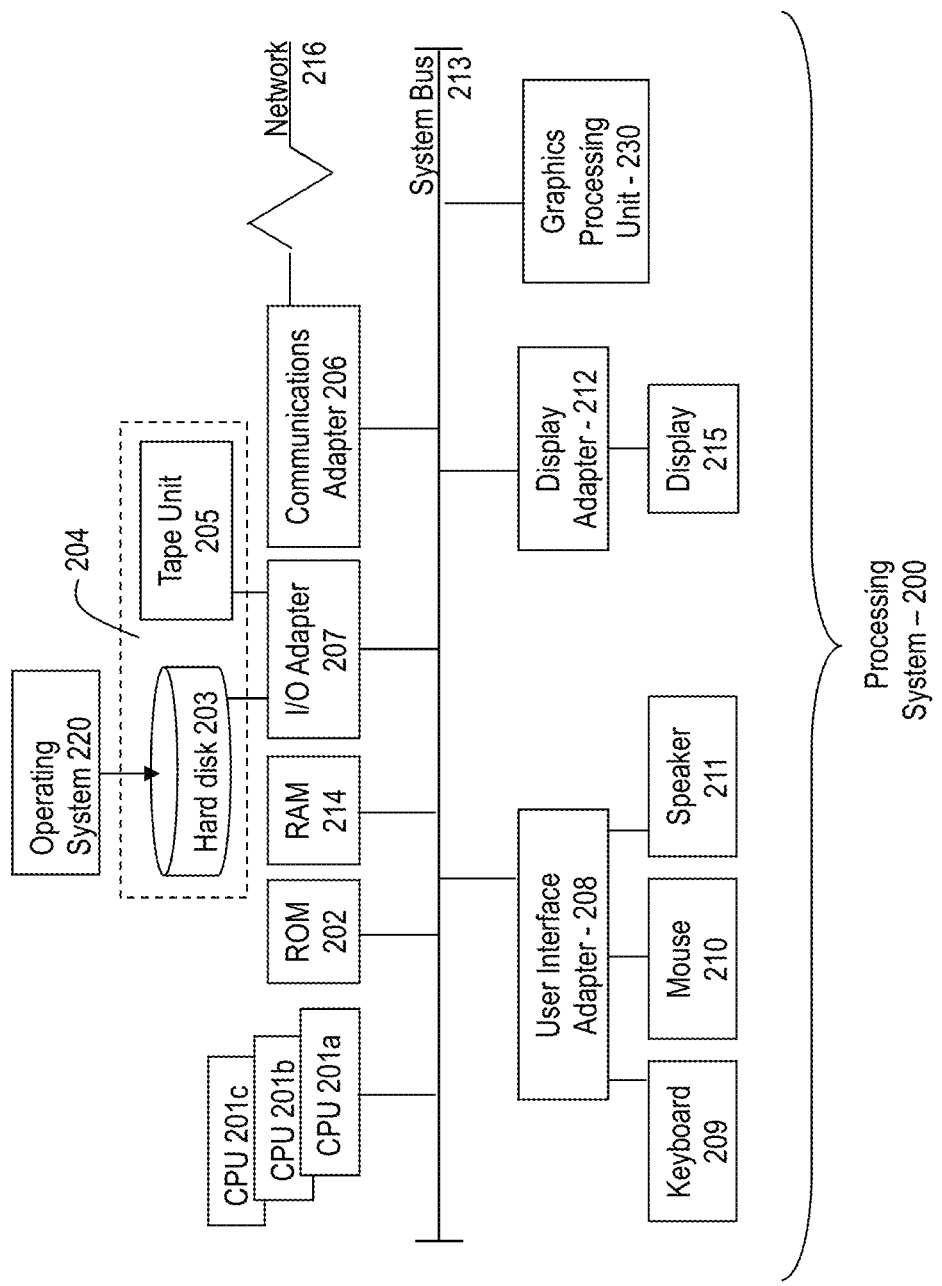
FIG. 2 depicts a system for practicing the disclosure described herein.

Referring to FIG. 2, there is shown an embodiment of a processing system 200 for implementing the teachings herein. In this embodiment, the system 100 has one or more central processing units (processors) 201*a*, 201*b*, 201*c*, etc. (collectively or generically referred to as processor(s) 201). In one embodiment, each processor 201 may include a reduced instruction set computer (RISC) microprocessor.

Processors 201 are coupled to system memory 214 and various other components via a system bus 213. Read only memory (ROM) 202 is coupled to the system bus 213 and may include a basic input/output system (BIOS), which controls certain basic functions of system 200.

FIG. 2 further depicts an input/output (I/O) adapter 207 and a network adapter 206 coupled to the system bus 213. I/O adapter 207 may be a small computer system interface (SCSI) adapter that communicates with a hard disk 203 and/or tape storage drive 205 or any other similar component. I/O adapter 207, hard disk 203, and tape storage device 205 are collectively referred to herein as mass storage 204. Operating system 220 for execution on the processing system 200 may be stored in mass storage 204. A network adapter 206 interconnects bus 213 with an outside network 216 enabling data processing system 200 to communicate with other such systems. A screen (e.g., a display monitor) 215 is connected to system bus 213 by display adaptor 212, which may include a graphics adapter to improve the performance of graphics intensive applications and a video controller. In one embodiment, adapters 207, 206, and 212 may be connected to one or more I/O busses that are connected to system bus 213 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 213 via user interface adapter 208 and display adapter 212. A keyboard 209, mouse 210, and speaker 211 all interconnected to bus 213 via user interface adapter 208, which may include, for example, a Super I/O chip integrating multiple device adapters into a single integrated circuit.

In exemplary embodiments, the processing system 200 includes a graphics processing unit 230. Graphics processing unit 230 is a specialized electronic circuit designed to manipulate and alter memory to accelerate the creation of images in a frame buffer intended for output to a display. In general, graphics processing unit 230 is very efficient at manipulating computer graphics and image processing, and has a highly parallel structure that makes it more effective than general-purpose CPUs for algorithms where processing of large blocks of data is done in parallel.

Thus, as configured in FIG. 2, the system 200 includes processing capability in the form of processors 201, storage capability including system memory 214 and mass storage 204, input means such as keyboard 209 and mouse 210, and output capability including speaker 211 and display 215. In one embodiment, a portion of system memory 214 and mass storage 204 collectively store an operating system to coordinate the functions of the various components shown in FIG. 2.

In one or more embodiments, the controller can be implemented on the processing system 200 found in FIG. 2. Additionally, the network 216 can be utilized for electronic communication between and among the controller and other devices. The network 216 can be in wired or wireless electronic communication with one or all of the elements of the system 200. Cloud computing can supplement, support or replace some or all of the functionality of the elements of the system 200. Additionally, some or all of the functionality of the elements of system 200 can be implemented as a cloud computing node. Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service.

The processing system 200 described herein is merely exemplary and not intended to limit the application, uses, and/or technical scope of the present disclosure, which can be embodied in various forms known in the art.

Figure 3:
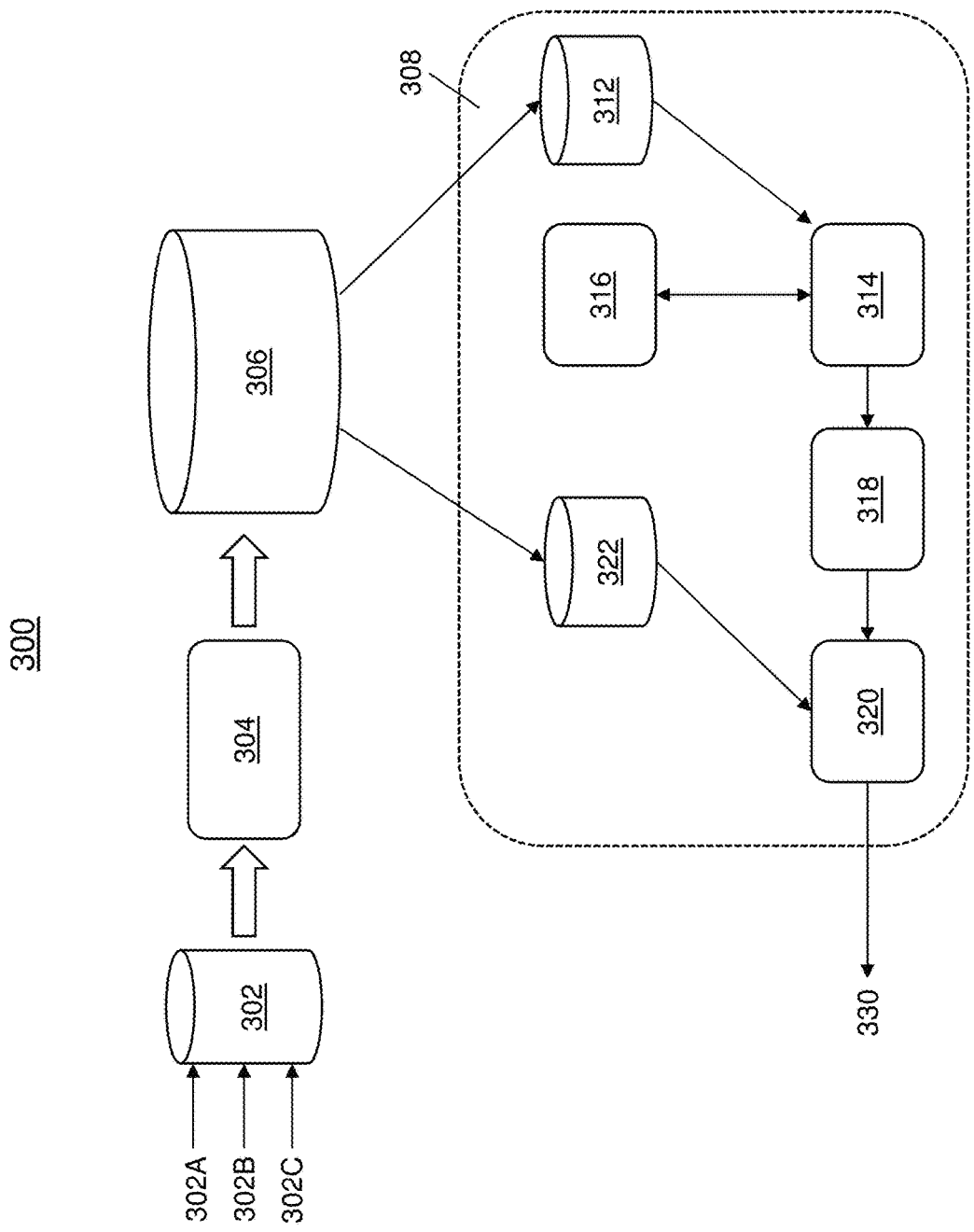
FIG. 3 depicts a system for developing a model framework for remote monitoring condition based maintenance.

Now referring to FIG. 3, a system 300 for developing a model framework for remote unit monitoring condition-based maintenance is provided. As shown in FIG. 3, the collected data are stored in a data archive 302. The data that is collected and stored can be from various sources which include unit data 302A, performance data 302B, service record data 302C, etc.

The unit data 302A include but are not limited to alarms and alerts that are related to the unit. In addition, the unit data 302A includes static technical data associated with the unit itself. For example, the technical data of an elevator unit can include but are not limited to the unit, model, brand, type, doors, market segment (i.e. hospital, school, and apartment), geographic location, etc.

Also, the models can be generated for a population of units where the requirements for a geographic region may be different from that of another geographic region. In this case, the models can be generated based on a specific geographic region to predict whether to a customer callback will be received. In other embodiments, the models can be generated based on the type of building (e.g., apartment, hotel, office, etc.), building size, or other desired grouping for the population. By collecting the data associated with the unit, various patterns can be identified over a period of time based on the different types of units based on the static data or a certain type of repair may be generally required among a variety of unit types.

The performance data 302B can include aggregated statistics. For example, the performance data can include a number of runs of an elevator, door reversals, slowly operating doors, doors not opening and closing, etc. In one or more embodiments, the performance data 302B can be provided from a remote unit monitoring systems such as a remote elevator monitoring system. The event data can include alarm and alert data, where the alarms can indicate an error in the performance of a system, and the alerts can include the warnings that were provided and/or triggered by the system. In one or more embodiments, a field organization or other operators can evaluate the particular of alarm type for accuracy. This informs the service mechanic with specific knowledge of the likely issue associated with the unit to provide a more targeted and specific maintenance visit about what is wrong with the unit.

The service record data 302C can include the date of a repair, type of repair, replaced components of a unit, duration of repair, successful repair, customer complaints and service mechanic's closeout report of the customer complaint, scheduled or unscheduled repairs, major repairs, normal maintenance schedules, etc. It should be understood that other types of data can also be included in the service record data 302C and is not limited by those mentioned above.

At processing block 304, the various features and labels are processed and used to obtain training data for developing the model. In one or more embodiments, the data will be labeled with the callback information or requests-for-service where these are the events whose history will be further analyzed. In one or more embodiments, the features can be extracted from the collected data at block 304 and used to generate a model used to predict a callback. When using supervised machine learning, a processing module is provided with example inputs and desired outputs, where a general rule is developed that maps the inputs to the outputs. In addition, the processing module implements active learning by obtaining training labels for a limited set of instances which is used to train the model at block 312. In an example, if a customer callback is received on a particular date, data will be analyzed for the preceding period of time such as two weeks or more to determine what caused the event. The model will be trained to look for a trend or pattern of data that indicates a similar type of failure is likely to occur.

At block 306, the modeling data is prepared for processing and used for developing the model at block 308. In one or more embodiments, the modeling data at block 306 provides the training data and test data to the model development block 308. In one or more embodiments, the development block 308 includes a decision-tree or decision-forest technique to develop the predictive model to determine when a request-for-service is likely to occur. The decision-tree learning is based on using decision-trees as a predictive model to map observations about an item to conclusions about the items target value. At the processing block 314, the training data 312 is received from the modeling data 306. After the processing block 314 is trained, a number of candidate models 316 can be developed to predict when a customer callback is likely to occur based on patterns or trends in the data are experienced by a unit.

Responsive to selecting a model from the plurality of candidate models 316, the final model 318 is provided to a subsequent validation block 320 to further verify the data with an independent set of test data 322 from the modeling data 306. Upon the final validation block 320, the model is used to predict a callback or request-for-service. The validation block 320 evaluates the accuracy of the model. The evaluation can be performed using a period-based (daily metrics) evaluation or an event-based evaluation technique. In an example, if a 20-day window is used for determining a request for service in the model, the period-based evaluation analyzes whether the events leading to the request have occurred on a daily basis where an event-based evaluation determines whether the event has occurred at any time during the 20-day window. The event-based evaluation can indicate how reliably the model is predicting callbacks.

The output 330 of the model development 308 includes a unit ID, an estimated health score for the identified unit, and the top features that contributed to the estimated health score. The health score per unit can provide an indication to the operator of the probability of having an unplanned request-for-service event in a certain time frame. The health score can be a value between 0.1 and 1.0 wherein 1.0 indicates a high probability of a callback occurring during a specified window of time. It should be understood that other scales can be used to represent the statistical callback probability that is based on the training data. In one or more embodiments, the models are generated using machine-learning techniques. The model searches for the data evidence that has been collected and stored during a window of time leading up to the customer callback. The same evidence is searched to predict if the event such as a customer callback will occur. In one or more embodiments, various trends and patterns can be determined for a unit that indicates a healthy or unhealthy unit. For example, in a supervised machine-learning algorithm, the previous 20 days of data leading up to a callback can be used to train the model. In this example, the labeling strategy of the supervised machine-learning is driven by customer complaints. It should be understood that other labeling strategies can be used such as serviceman reports, updated sensor packs, etc.

Figure 4:
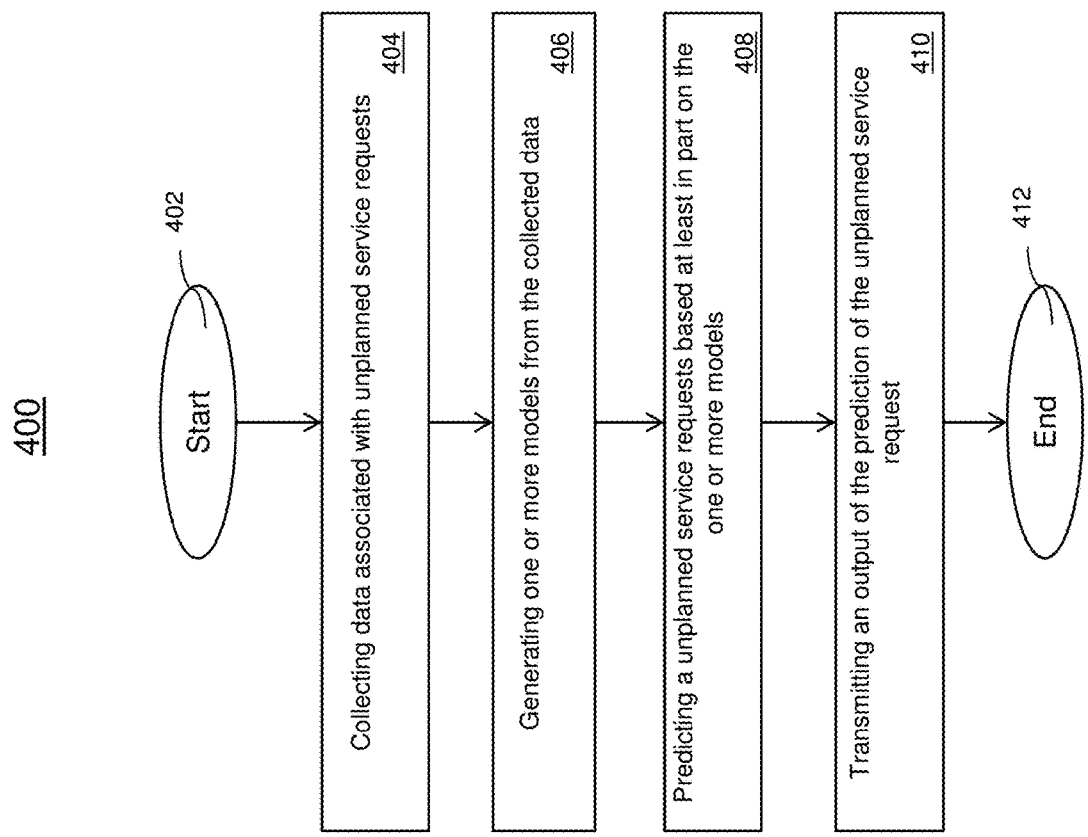
FIG. 4 depicts a flowchart of a method for developing a framework for remote monitoring condition based maintenance.

Now referring to FIG. 4, a flowchart of a method 400 for developing a model framework for remote monitoring condition-based maintenance in accordance with one or more embodiments. At block 402, the method 400 begins and proceeds to block 404 which provides for collecting data associated with an unplanned service request. In one or more embodiments, responsive to receiving a customer callback the historical data is obtained to analyze the events and/or operational symptoms of the system that led to the customer complaint. The data includes static technical data of the unit, operational and performance data such as alarms and alerts, service record data such as call back information, etc.

The method 400, at block 406 which provides for generating a model from the collected data. In one or more embodiments, the data can be analyzed using a machine-learning technique such as a supervised machine-learning. For example, labeled data is provided to the processing module for training. In one or more embodiments, the labeled data are "requests for service" or callbacks. In the event a callback is received, the data that is received in a time interval or window leading up to the request for service is analyzed. A model can be generated for the request for service where a set of data indicating a common set of conditions or a pattern of operational symptoms can be flagged and further investigated. Multiple candidate models can be generated based on the data that has been collected overtime. Responsive to generating multiple candidate models from the data, a final model is selected from the candidate models. In one or more embodiments, a k-fold cross validation (CV) scheme (where k is an integer) can be used to select the final model. For example, in a 5-fold CV scheme where k=5, the training data can be divided into 5 equal partitions (A, B, C, D, and E). The training is performed on partitions BCDE, and the performance is validated using partition A as the validation set. A score representative of the model's performance is tracked. In the next iteration, training is performed on partitions ACDE, validated on partition B, and the score representative of the performance is tracked. The CV scheme iterates through all partitions and the final performance is averaged, where the model resulting in the best or optimal cross-validation performance score is selected as the final model. The final model can be verified using independent test data having expected outputs which can be used to further optimize the predictive model. It is to be understood that other techniques can be used to select the final model.

At block 408, the method 400 provides for predicting an unplanned service request based at least in part on the model. Responsive to generating the model, a customer callback for an issue can be predicted. In one or more embodiments, a maintenance schedule or service visit can be adapted to address the predicted issue prior to receiving a customer callback regarding an issue with the unit.

Block 410 provides for transmitting an output of the model. The output of the mode can include information such as the unit ID, an estimated health score for the unit, and the top features that contributed to the estimated health score. The unit ID identifies the unit that is the subject of the potential customer callback. The estimated health score is related to the probability of a request-for-service event. The top features can be provided to the service mechanic or used during maintenance to conduct a more targeted and/or focused repair. In addition, the service mechanic is provided information leading to the callback prior to performing the service. It should be understood that the information that is output from the model can be updated over time. The method 400 ends at block 412.

Figure 5:
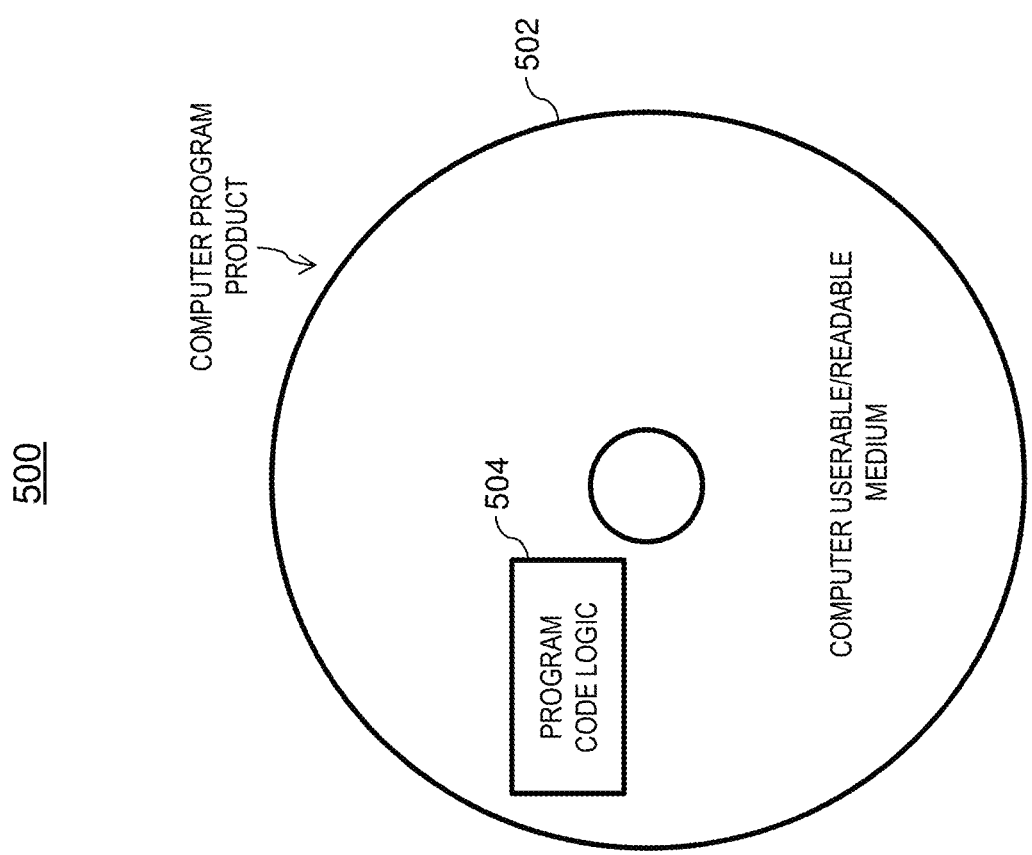
FIG. 5 depicts a computer program product in accordance with one or more embodiments.

Referring now to FIG. 5, a computer program product 500 in accordance with an embodiment that includes a computer-readable storage medium 502 and program instructions 504 is generally shown.

The technical effects and benefits include using data-driven model using machine learning to predict a model to obtain operational efficiency gains that result from predictive and targeted insights indicating that a unit is unhealthy where an unhealthy unit may result in an unplanned service request. The technical effects and benefits of the modeling process include achieving a most effective predictive model, customized for the given available data in a standardized and automated way.

As described above, embodiments can be in the form of processor-implemented processes and devices for practicing those processes, such as a processor. Embodiments can also be in the form of computer program code containing instructions embodied in tangible media, such as network cloud storage, SD cards, flash drives, floppy diskettes, CD ROMs, hard drives, or any other computer-readable storage medium, wherein, when the computer program code is loaded into and executed by a computer, the computer becomes a device for practicing the embodiments. Embodiments can also be in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes a device for practicing the embodiments. When implemented on a general-purpose microprocessor, the computer program code segments configure the microprocessor to create specific logic circuits.

The term "about" is intended to include the degree of error associated with measurement of the particular quantity and/or manufacturing tolerances based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Those of skill in the art will appreciate that various example embodiments are shown and described herein, each having certain features in the particular embodiments, but the present disclosure is not thus limited. Rather, the present disclosure can be modified to incorporate any number of variations, alterations, substitutions, combinations, sub-combinations, or equivalent arrangements not heretofore described, but which are commensurate with the scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A system for developing a model framework for remote unit monitoring condition-based maintenance, the system comprising:
    a processor and a storage medium coupled to the processor;
    the processor configured to:
        execute one or more models operable to perform operations comprising predicting an unplanned service request;
        wherein the one or more models are trained to perform the operations by identifying an actual unplanned service request that has occurred, collecting unplanned service request data limited to a time interval leading up to the actual unplanned service request, wherein the unplanned service request data limited to the time interval leading up to the actual unplanned service request comprises a set of data indicating a pattern of operational symptoms predictive of the unplanned service request, and using the unplanned service request data to train the one or more models to perform the operations;
        wherein performing the operations comprise generating a predicted unplanned service request based at least in part on the one or more models; and
        transmit an output of the predicted unplanned service request.

2. The system of claim 1, wherein the unplanned service request data comprises at least one of unit data, performance data, or service records.

3. The system of claim 2, wherein the unplanned service request data comprises at least two of the unit data, performance data, or service records.

4. The system of claim 2, wherein the unplanned service request data comprises the unit data, performance data, and service records.

5. The system of claim 1, wherein the actual unplanned service request is for a unit, wherein the unit is at least one of an elevator unit or an escalator unit.

6. The system of claim 2, wherein the one or more models are generated using a supervised machine-learning process.

7. The system of claim 4, wherein generating the one or more models comprises generating a health score for the unit.

8. The system of claim 1, wherein the processor is configured to select a model of the one or more models, and test the selected model based on an independent dataset from the unplanned service request data.

9. The system of claim 1, the output comprises at least one of a unit ID, an estimated score related to the probability of a request for service request, and one or more features that contributed to the estimated score.

10. The system of claim 9, wherein the output is used to update a maintenance schedule.

11. A method for developing a model framework for remote unit monitoring condition-based maintenance, the method comprising:
    executing one or more models operable to perform operations comprising predicting an unplanned service request;
    wherein the one or more models are trained to perform the operations by identifying an actual unplanned service request that has occurred, collecting unplanned service request data limited to a time interval leading up to the actual unplanned service request, wherein the unplanned service request data limited to the time interval leading up to the actual unplanned service request comprises a set of data indicating a pattern of operational symptoms predictive of the unplanned service request, and using the unplanned service request data to train the one or more models to perform the operations;

wherein performing the operations comprise generating a predicted unplanned service requests based at least in part on the one or more models; and transmitting an output of the predicted unplanned service request.

12. The method of claim 11, wherein the unplanned service request data comprises at least one of unit data, performance data, or service records.

13. The method of claim 12, wherein the unplanned service request data comprises at least two of the unit data, performance data, or service records.

14. The method of claim 12, wherein the unplanned service request data comprises unit data, performance data, and service records.

15. The method of claim 11, wherein the actual unplanned service request is for a unit, wherein the unit is at least one of an elevator unit or an escalator unit.

16. The method of claim 12, wherein the one or more models are generated using a supervised machine-learning process.

17. The method of claim 14, wherein generating the one or more models comprises generating a health score for the unit.

18. The method of claim 11, further comprising selecting a model of the one or more models, and testing the selected model based on an independent dataset from the unplanned service request data.

19. The method of claim 11, wherein the output comprises at least one of a unit ID, an estimated score related to the probability of a request for service request, and one or more features that contributed to the estimated score.

20. The method of claim 19, further comprises updating a maintenance schedule based at least in part on the output.

* * * * *